United States Patent

Newman et al.

[11] Patent Number: 6,049,748
[45] Date of Patent: Apr. 11, 2000

[54] MASSAGE CONTROLLER MODULE (MCM)

[75] Inventors: Todd Newman, Reed City; David Shank, Big Rapids; John Washeleski, Cadillac, all of Mich.

[73] Assignee: Nartron Corporation, Reed City, Mich.

[21] Appl. No.: 08/936,479

[22] Filed: Sep. 18, 1997

Related U.S. Application Data

[63] Continuation-in-part of application No. 08/918,918, Aug. 27, 1997.

[51] Int. Cl.[7] .................................. A47C 7/46; H02P 1/22
[52] U.S. Cl. .......................... 701/49; 297/284.4; 318/267
[58] Field of Search ............................ 297/284.1, 284.4, 297/284.8, 284.7; 701/49; 296/65.08, 65.16; 318/466, 467, 267

[56] References Cited

U.S. PATENT DOCUMENTS

| | | | |
|---|---|---|---|
| 4,706,194 | 11/1987 | Webb et al. | 701/49 |
| 5,135,282 | 8/1992 | Pappers. | |
| 5,243,267 | 9/1993 | Ogasawara | 297/284.4 |
| 5,455,494 | 10/1995 | Ogasawara | 318/267 |
| 5,523,664 | 6/1996 | Ogasawara | 297/284.4 |
| 5,567,011 | 10/1996 | Sessini | 297/284.7 |
| 5,816,653 | 10/1998 | Benson | 297/284.4 |

*Primary Examiner*—Virna Lissi Mojica
*Attorney, Agent, or Firm*—Brooks & Kushman P.C.

[57] ABSTRACT

An electronic control system is an in-line module for addition to or partial replacement of automotive vehicle seat control systems for providing massage and improved features of functional control, especially human lumbar massage and diagnostics. The module provides the following improved functions and features: an enhanced driver for automatic lumbar massage, or user taught lumbar massage cycle, and a transparency simulator for low power standby operation, motor stall protection, open motor circuit detection, short motor circuit protection, motor low current protection, motor over current protection, seat position sensor malfunction detection, electrical motor noise attenuation, electrical noise filtering, and also other options. These improvements do not require alternative wiring harness changes and do not affect existing operations of a memory or non-memory seat control mechanism.

15 Claims, 8 Drawing Sheets

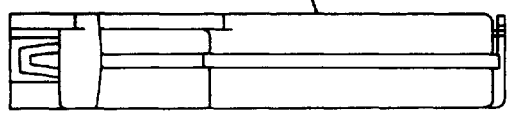
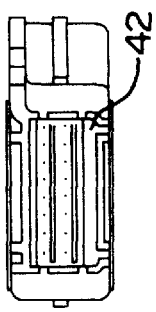
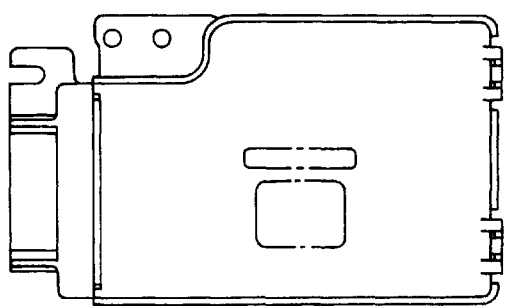
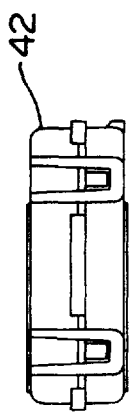
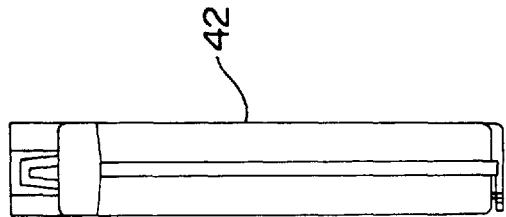

MASSAGE CONTROLLER MODULE (MCM)

CROSS-REFERENCE TO RELATED APPLICATION

This application is a continuation-in-part of an application Ser. No. 08/918,918, entitled "In-Line Module For Attenuating Electrical Noise", filed in the U.S. Patent and Trademark Office on Aug. 27, 1997, and commonly owned.

TECHNICAL FIELD

This invention relates to vehicle seat control systems with controller modules added to or replacing seat movement controls to provide advanced control, diagnostics, and functional features in the seat control system including massage.

BACKGROUND ART

Lower back pain and discomfort for humans is a well known occurrence related to trauma, osteoporosis, poor muscular condition, poor blood circulation, biochemical imbalances, being overweight, insufficient movement, etc. Certain of the above-related situations plus physical tension, bumpy road conditions, and traffic-related tensions are known to cause and/or to aggravate pain and discomfort in the lumbar region of the lower back. Some people who spend time riding or driving in a vehicle are in mild to severe discomfort possibly in part due to factors related to driving or riding or possibly due totally to other factors independent of driving or riding. Vehicle is herein construed as including car, truck, rail train, airplane, and the like.

Increasing numbers of automotive vehicles have an electromechanical motor driven or, a pneumatic seat multiple support adjustment, controller system offering optional upscale features which include incorporation of a seat lumbar support position sensor and a memory module for closed loop feedback positioning of various supports in the seat relative to user set, controller module memory settings. For example, this allows a person, identified as and with a controller # one, to adjust various seat adjustment positions to an individual preference, and then set memory # one for these settings. When the recall position # one switch actuator is manipulated, for example, a button is pressed, the seat will return to the multiple adjusted preference settings set by driver # one. Likewise, person # two may set memory # two and recall position # two, if the system is designed for additional personal settings. The basic seat lumbar adjustment control offers no lumbar position sensor. The optional system upgrade version typically includes a modular controller having the seat position memory feature which necessarily includes availability of a seat position sensor system. However, these systems do not provide the advantages of massage.

Therapeutic cushions for non-ambulatory and burn patients have been commercially produced since at least 1988. However, these systems also adjust to support the patient but do not provide massage capability in a seating system that is readily adapted to motor vehicles.

SUMMARY OF THE INVENTION

The present invention overcomes the above-mentioned disadvantages by providing a modular system of seat control features adapted for functionally improving a wide variety of hardware and controls for vehicle seating system applications. Complementary in-line modules incorporating monitoring and control algorithms cooperate with signal and power control to implement the desired new control functionality of relaxing and soothing automatic lumbar massage. This massage control can provide numerous advantages including encouraging blood circulation even to the capillary level by cyclicly increasing the stress and therefore pressure which will force blood flow, and then lowering the stress and therefore the pressure possibly below which venous capillary flow can naturally occur. Additional advantages include stretching and relaxing muscles, varying strain on skeletal members, varying strain on cartilage between articulating skeletal members so as to encourage rejuvenation of its natural synovial fluid lubricant, and also producing the relaxed feeling a person gets from being stroked in a soothing manner.

Included among the improved driver functions and feature capabilities are automatic lumbar massage and user taught lumbar massage cycle. In addition, transparency simulator functions include prioritizing original functions, low power standby operation, motor stall protection, open motor circuit detection, short motor circuit detection, motor low current protection, motor over current protection, seat position sensor malfunction detection, electrical motor noise attenuation, electrical noise filtering, and other options. References to the transparency simulator refer to the feature that the seat control module is transparent in function to the existing seat control mechanism, regardless of whether it enhances the system function, monitors the system function, or guides the system function through virtual signals.

An in-line module interfaces and integrates with existing and future automotive seat control hardware and software, as pertinent, to provide complementary functions especially including the new automatic seat lumbar massage feature. This new function is provided by a controller module of relatively small size which requires only minimal or no wiring change to the existing seat control circuitry, yet appears to be virtually nonexistent to and allows full priority to all functionality of the existing seat controls.

It should be apparent that the utility of this automatic massage function is not exclusive only to specific human lumbar massage but can similarly be applied to other vehicle seat supports and cushions and also can be applied to non-vehicle types of therapeutic and comfort seats, cushions, supports, and mattresses using motive methods including electrical, mechanical, pneumatic, hydraulic, and combinations thereof. For example, a general embodiment of this concept is an automatic controlled therapeutic and/or comfort cushion for sitting and/or lying down for use by non-ambulatory and/or generally immobile animal subjects. By sequentially raising and lowering pressures in various body areas in contact with the cushion, blood circulation is promoted, bedsores are prevented, need to roll and/or move subject is reduced, and interruption of sleep due to need for changing position is reduced.

The existing seat controller module can be supplemented or replaced with an alternative massage control module (MCM) offering current control features plus increased functionality upgrades, especially to include the new and improved feature of automatic lumbar massage without affecting the original functions. It should be understood that for seat control systems having memory set and recall features, the existing electronic seat controller module either can be complemented by addition of the module to the system, or alternatively can be replaced by another version of the controller which incorporates all functionality into one single unit. In seat control systems having no memory set and recall features, a simple seat control system having no electronic seat controller module will be referred to as a seat control, and as such the module will preferably be a complementary addition to the system. Enhanced functional operations include automatic lumbar massage, and user taught lumbar massage cycle, while a transparency simulator provides low power standby operation, motor stall protection, open motor circuit detection, short motor circuit detection, motor low current protection, motor over current protection, seat position sensor malfunction detection, electrical motor noise attenuation, electrical noise filtering, and also numerous other previously disclosed options per patent application Ser. No. 08/918,918, filed Aug. 27, 1997, and entitled "In-Line Module For Attenuating Electrical Noise", and incorporated by reference herein.

BRIEF DESCRIPTION OF THE DRAWINGS

The present invention will be more clearly understood by reference to the following detailed description of a preferred embodiment when read in conjunction with the accompanying drawing in which like reference characters refer to like parts throughout the views and in which:

FIG. 9 is a side view of a preferred module housing for a massage control according to the present invention;

FIG. 10 is a top view of the preferred module housing shown in FIG. 9;

FIG. 11 is a front view of the preferred module housing shown in FIGS. 9–10;

FIG. 12 is a bottom view of the preferred module housing shown in FIGS. 9–11; and FIG. 13 is a side view of the preferred module housing shown in FIGS. 9–12.

DETAILED DESCRIPTION OF THE PREFERRED EMBODIMENT

The massage control module enhances movement of the lumbar support cushion in the preferred embodiment by repeating linear back and forth motion of the lumbar support to effect a comforting massage function for the uncomfortable lower back or simply for the person who enjoys an occasional soothing lumbar massage. The massage control module of the preferred embodiment is designed for use in automobiles, adding the massage feature not available in existing seating systems, either memory type seat controllers or non-memory type seat controls, without affecting operation of the existing seat controls.

Figure 1:
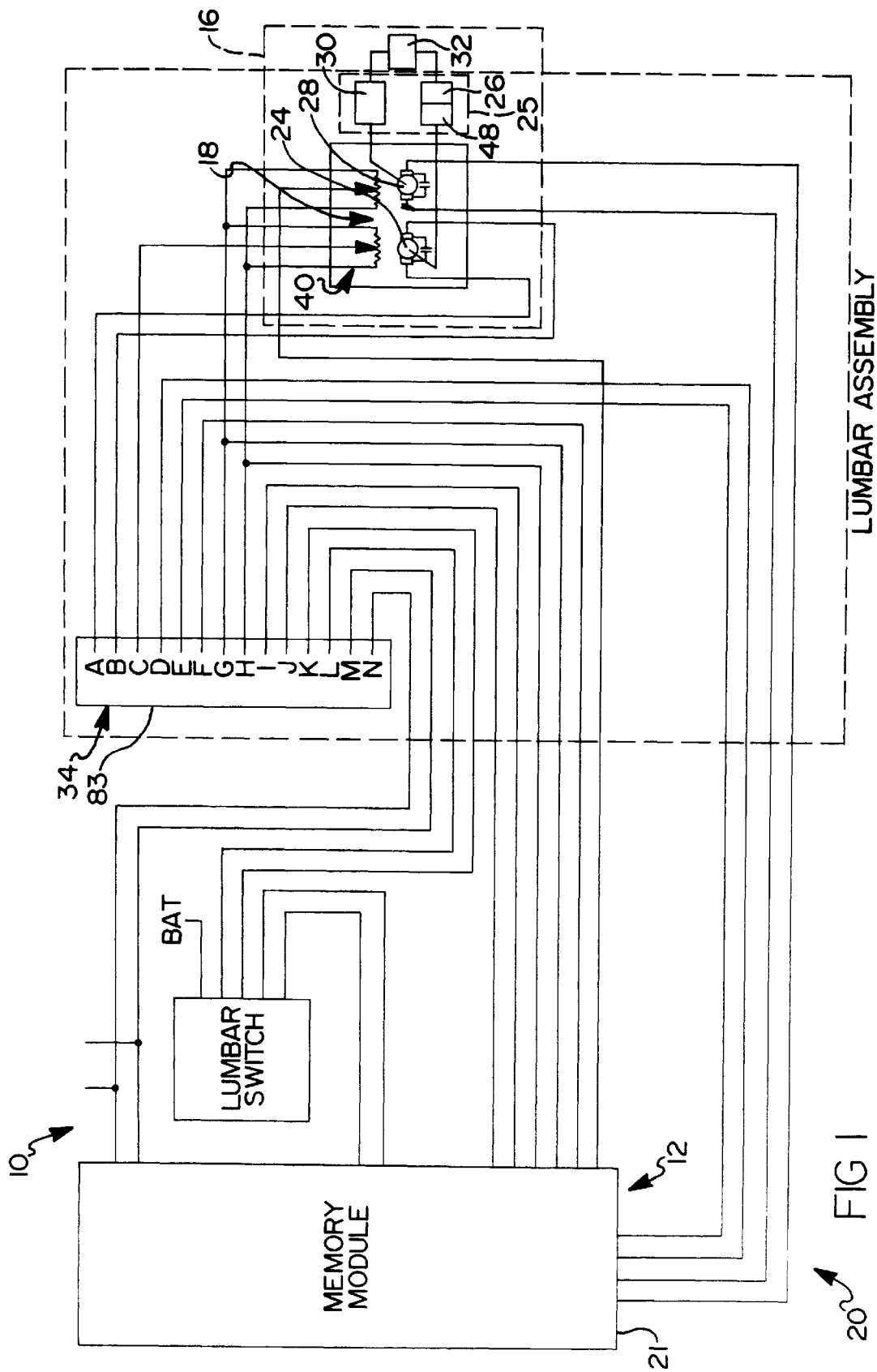
FIG. 1 is a diagrammatic, partly schematic view of a vehicle seat control system with position memory and implementing a massage control module according to the present invention.
Figure 2:
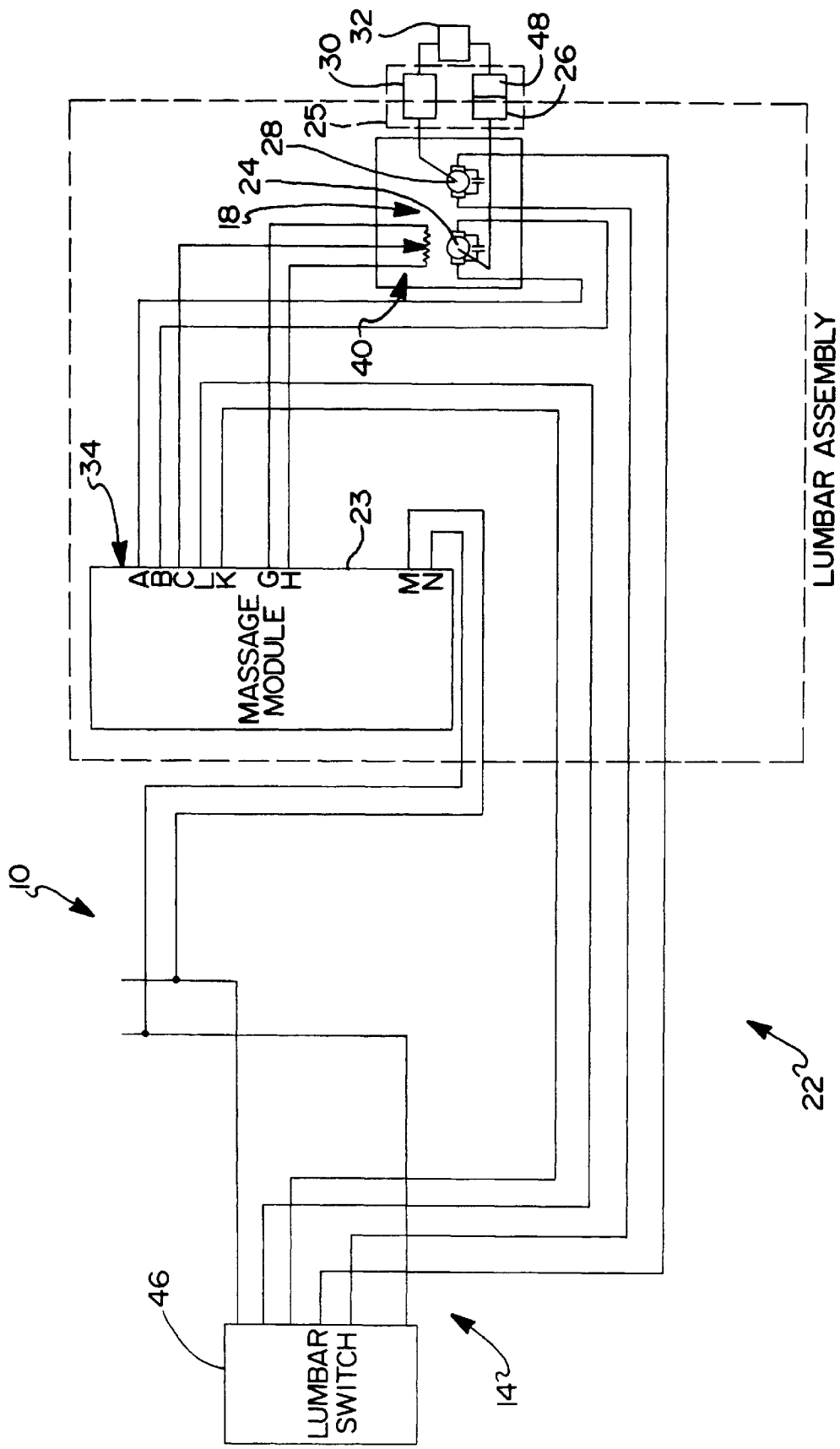
FIG. 2 is a diagrammatic, partly schematic view of a vehicle seat control system without position memory and implementing a massage control module according to the present invention.

Referring first to FIGS. 1 and 2, a motor vehicle seat control system 10 is thereshown employing a control mechanism 12 (FIG. 1) or a control 14 (FIG. 2) for driving a seat mechanism 16. In either event, the seat mechanism 16 includes motors 18 for driving portions of the seat with respect to other portions of the seat or with respect to support for the seat. In the preferred embodiment, a first version 20 (FIG. 1) of the vehicle seat system 10 includes memory set and recall module 21 for repositioning all movable features of the seat to a predetermined position selected by an occupant. A non-memory version 22 (FIG. 2) employs simpler controls for adjusting seat positions such as seat height, back inclination, forward and reverse positioning, and tilting of the seat base. Moreover, it will be understood that the present invention can also be implemented with a wide variety of seat systems regardless of the particular vendor or the models provided by the vendor to provide a massage function without interfering with seat control, seat mechanism, or electrical connections of the seat controls.

In the preferred embodiment, a first motor 24 controls a movement mechanism 26 for displacement of the lumbar support 32 upwardly and downwardly through the seat back. A second motor 28 controls a lumbar support extender 30 and it governs the degree to which the lumbar support extends outwardly from the seat back toward a spinal curvature of an occupant. Both mechanisms 26 and 30 affect the position of the lumbar support 32 of the seat mechanism 16.

Referring to FIGS. 9–13, the massage control module 34 is relatively small so as to be able to be mounted under the drivers' or front passengers' seat and can integrate and interface with existing hardware and wiring harnesses, as applicable, to provide lumbar massage and other functions. In some cases, it may be practical to modify or redesign the wiring harness to facilitate integration of the massage control module into the system.

Any automotive seat adjustment system for which a lumbar support position sensor is engineered and available as a standard or as an optional offering is a candidate for integration of a massage control module 34. According to the present invention, the massage control module 34 is a modular controller which improves functional capability in one of several forms of a seat control system 16. In addition, the module may simulate a transparent connection, for example, by installation as an in-line complement to or a replacement of an existing memory type seat controller 36 or as a complement to an existing non-memory type seat control 23. The non-memory type seat control 23 may be adapted by using the seat lumbar support cushion position sensors 40 previously engineered and coupled for operation with the optional memory type module controller 36.

In the case of a non-memory type seat control system 22 which offers no existing optional lumbar support position sensor 40, the lumbar support position can alternatively be analytically derived in various ways such as an absolute encoder on the motor where added expense can be accommodated. A resolver on the motor or a simple incremental encoder on the lumbar support drive motor may be used in less expensive embodiments. With resolvers and encoders, appropriate algorithms and motor stall current detection can be used to determine lumbar position, preferably within a tolerance of one motor revolution where tens or hundreds of revolutions are required between end of travel (EOT) limits.

Alternative to determining lumbar support position by direct measurement of some physically sensed variable is the option of empirically measuring the relative amounts of time, under ambient conditions of temperature, voltage, and lumbar load, to drive the lumbar support from either end of travel (EOT) limit to the present home position and from each end of travel (EOT) physical limit to the opposite as determined by lumbar drive motor stall current detection or end of travel limit switches. Preferably, the massage control module 34 uses some sensor, signal, or algorithm for determination of lumbar support position and automated commands for returning lumbar support 32 to its home position at the finish of the lumbar massage function.

In the preferred embodiments, a sensor 40 is installed in an existing non-memory system 14 when the module 34 is added. The lumbar vertical position sensor provides an analog voltage which varies directly with the seat lumbar vertical position. The voltage increases in the up direction and decreases in the down direction. The minimum range remaining at each end of travel is not less than 10% of the sensor feed voltage. The lumbar vertical position sensor provides a resistance of 10 K±20%. If the potentiometer is found to be out of range, the massage module includes compensation that will still have the ability to perform massage and continue to send the simulated sensor signal to the memory seat module.

In a memory seat module, the massage module will receive the 5 volt sensor feed from the memory seat module. In a non-memory seat, the massage module will provide a supply voltage for the lumbar vertical sensor when a sensor is installed. The module activates the sensor feed output whenever the module is awake. Otherwise, the sensor feed output remains inactive.

Figure 3:
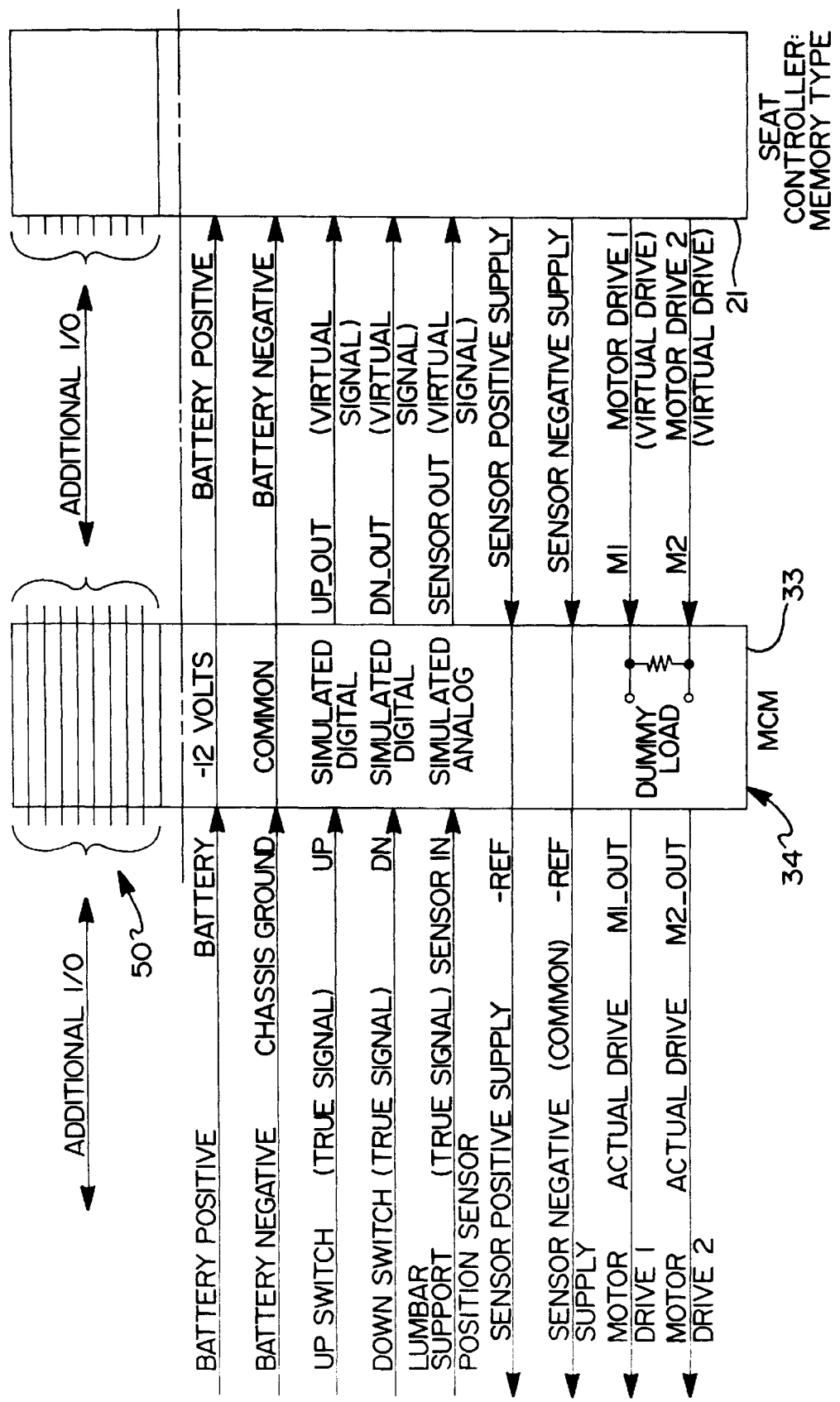
FIG. 3 is a block diagram representation of the in-line characteristics of the massage control module relative to the existing memory type seat controller.
Figure 4:
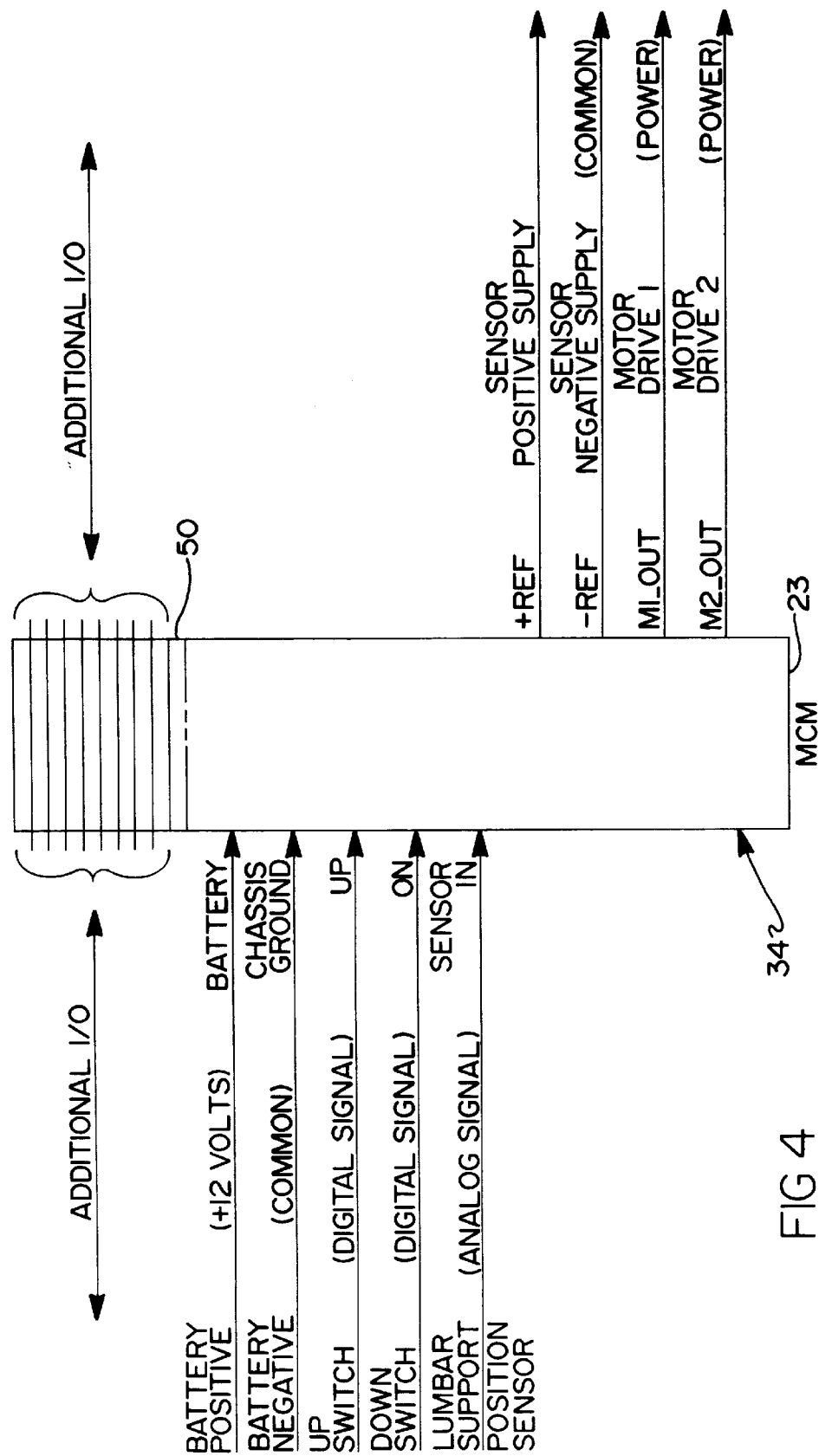
FIG. 4 is a block diagram representation of the in-line characteristics of the massage control module relative to the existing non-memory type seat control.
Figure 5:
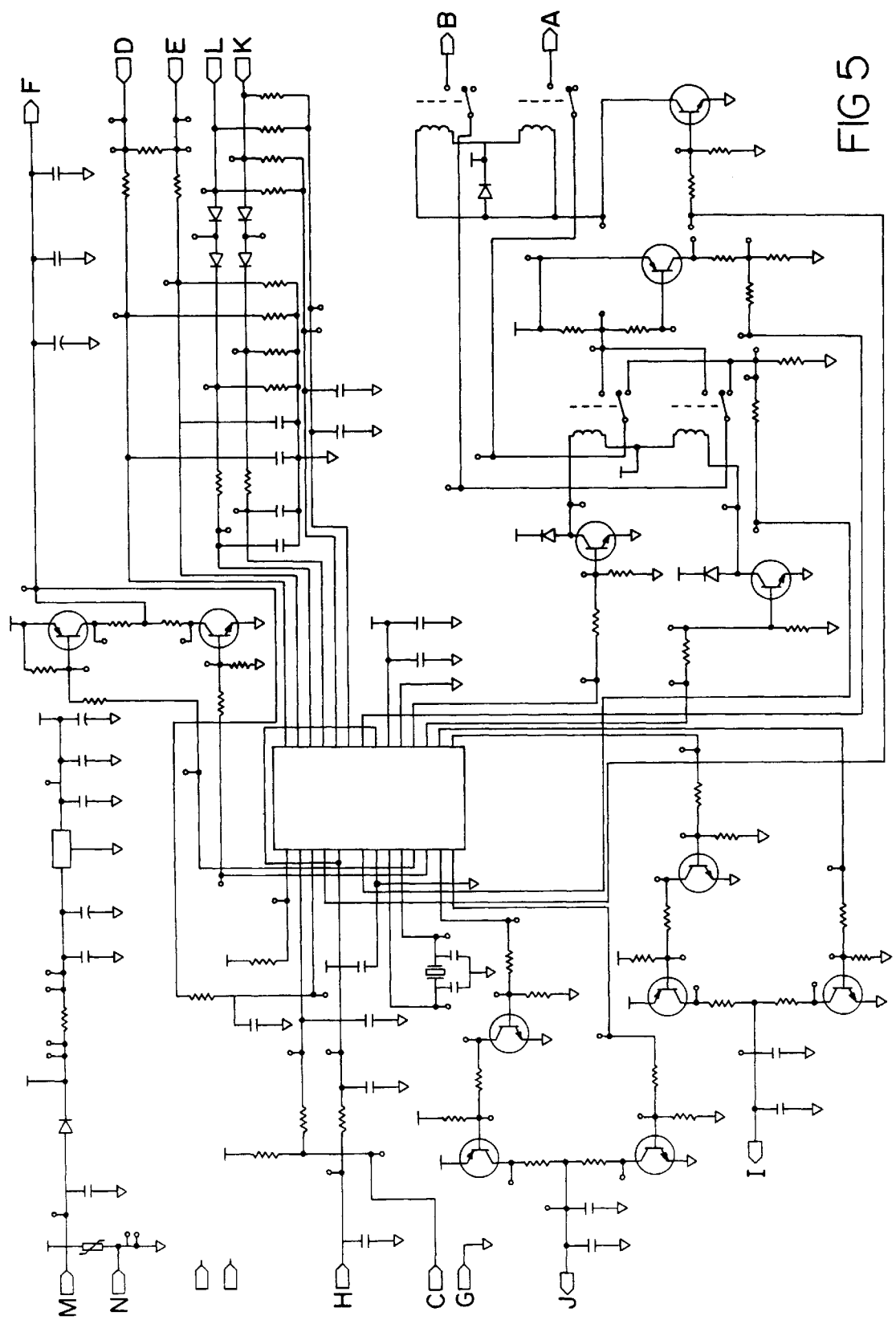
FIG. 5 is an electronic schematic diagram of the massage control module for use with the memory type seat controller.
Figure 6:
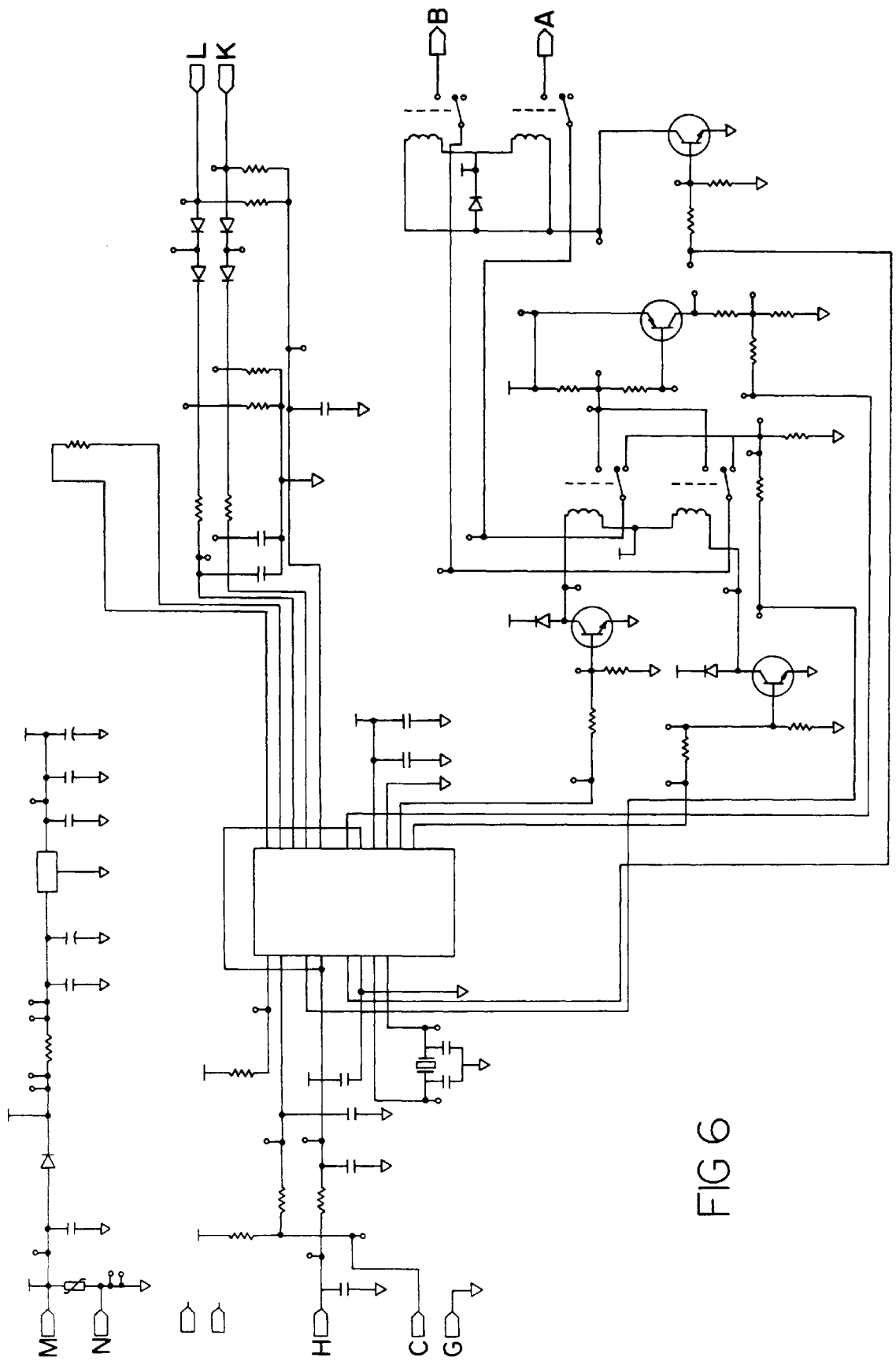
FIG. 6 is an electronic schematic diagram of the massage control module for use with the non-memory type seat controller.

Present embodiments provide two main versions of the massage control module 34. Referring to FIGS. 1, 3 and 5, the first massage control module 33 version is designed for seats with existing seat controller modules 21 having the position memory feature, and thus already have the position sensor 40 integral to the system 20. The massage control module 33 will function in low priority dependent operation to provide enhanced movement of the lumbar support 32, and integrated with the high priority operation original of the seat controller module. Referring to FIGS. 2, 4 and 6, the second massage control module 23 is physically similar in appearance to the first massage control module 33 but has simpler hardware and is programmed for use with existing seat controls 22 not having the position memory feature. It will not interface with any other motor controller and will function in low priority dependent operation to provide the lumbar massage feature for that seat mechanism 16.

As best shown in FIGS. 5 and 6, both the memory type module 33 (FIG. 5) and the non-memory type massage control module 23 (FIG. 6) use the same module housing 42 (FIGS. 9–13), printed circuit board (FIGS. 5 and 6), microcontroller 44, and algorithms in the software programs. Different components populate the printed circuit for the memory type versus the non-memory type massage control module. The memory type massage control module 33 uses its microcontroller inputs and outputs, having tri-state capability, to poll both massage control module and external interface circuitry. Polling discerns the type of external interface switching and electronics in a seat control or seat control module from different vendors and for different models and thus to determine which particular control algorithms are appropriate for example as described below, and determines the biasing, to be applied to certain microcontroller outputs for correct operation. The module provides watchdog capability to trap and recover from any software or addressing problem which may prevent normal operation.

The following descriptions will explain the methods by which the massage control module determines the types of external switchpad interface circuitry and the necessary logic level output biases. Upon power up by connection with an the electrochemical storage battery and with the program assumptions that there are no switch actuations for UP or DN and that there are no system circuit faults, a first immediate microcontroller test is for the existence of resistor RJ1 across the microcontroller 44 tri-state I/Os RB7 and RB6. This is done by outputting a logic high signal at tri-state I/O RB6 and reading the logic value at tri-state I/O RB7. If RB7 is logic low, then the unit 20 is a memory type massage control module 21.

If RB7 is logic high, then the unit might be a non-memory type massage control module. A low logic signal is output at RB6 and the logic value is read at RB7. If RB7 is logic high, then the unit is a memory type massage control module and if RB7 is logic low, then the unit might be a non-memory type massage control module. If and only if the logic state of RB7 matches the logic state of RB6 in both high and low logic states, then the resistor RJ1 exists, the unit is therefore determined to be a non-memory type massage control module, resistors R45 and R24 do not exist by design, then tri-state I/O RB2 is held in a high impedance floating state until the microcontroller is reset, and then tri-state RB3 is held in a low logic state until the microcontroller is again reset.

If the unit self determines that it is a non-memory type massage control module, then the commercial interface seat control switchpad interface circuit is known to be active high per FIG. 6, such that when either the up switch or the down switch is actuated, the respective UP or DN input terminal is electrically connected to +12 V. When unactuated, each switch in switch pad 46 is back connected via all of the other normally closed switches of the seat control switchpad 46 to pulldown resistors. When between actuation and deactuation, each switch is in an electrical floating state. Electrical floating inputs of the CMOS microcontroller must be eliminated in order to eliminate potential erratic oscillations of logic state, and in the case of the active high switchpad interface circuitry, microcontroller 44 will always output a logic low signal voltage at RB3 so as to pull down (bias) via 2.4 KOhm resistors R23 and R46 their respective terminals UP and DN for respective input RB5 and input RB4 until the microcontroller 44 is again reset. Thus, unactuated UP and DN switches are both electrically pulled down (or biased) to logic low by the massage control module microcontroller 44 and are pulled up to logic high by the lower impedance external switchpad circuitry whenever their respective switch is actuated.

Figure 8:
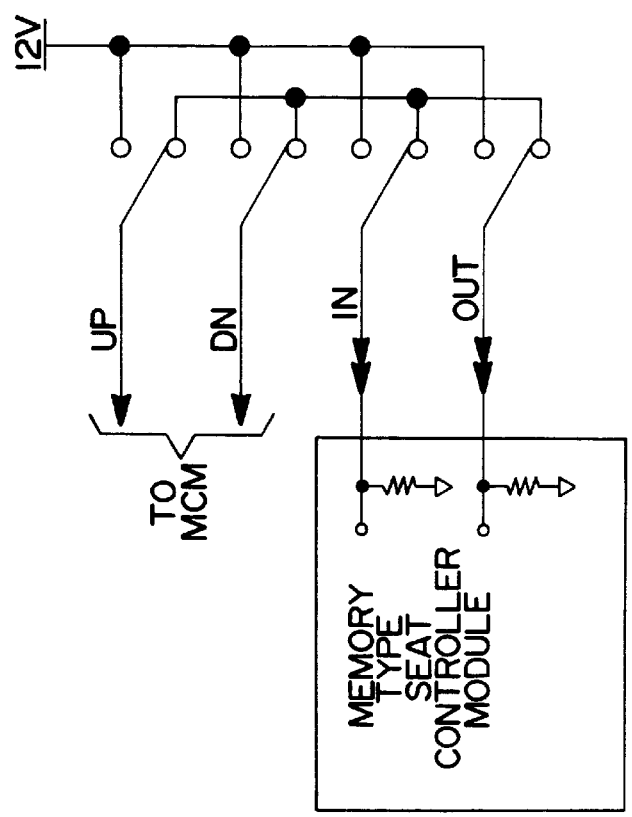
FIG. 8 is a partial wiring diagram showing in unactuated state of the type of control switchpad having active high switching and showing the circuit by which the seat controller can affect the massage control module.
Figure 7:
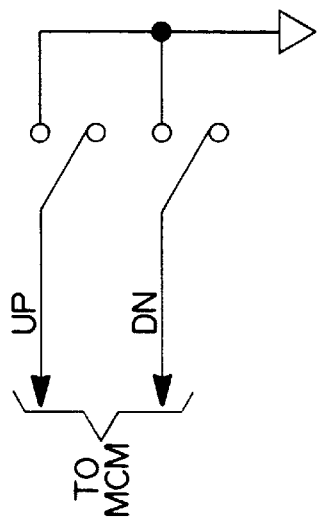
FIG. 7 is a partial wiring diagram showing the unactuated state of the type of control switchpad having active low switching.

Alternatively, immediately after self determination that the massage control module coupled in a memory type system 20 upon power up, it must then subsequently determine whether the external switch interface circuitry is active high, relative to FIG. 8, or whether the external switch interface circuitry is active low, relative to FIG. 7, explained as follows. The massage control module microcontroller 44 will output a high logic level at RB3 to attempt to electrically pull up via 2.4 KOhm resistors R23 and R46 their respective terminal connections UP and DN for respective inputs RB5 and RB4. Then, if either RB5 from UP or RB4 from DN is logic low due to lower impedance electrical pull down resistors to common via the unactuated switchpad with its associated module circuitry then the interface switchpad circuitry is determined to be active high. Or if RB5 and RB4 are both logic high due to the unactuated switchpad circuitry being in the electrically floating state, then the switchpad interface circuitry is determined to be active low.

In the proposed embodiment, a logical AND is required at RB5 and RB4 to determine active low, and a logical OR is required at RB5 and RB4 to determine active high. Because values for resistors in the massage control module, the external interface switchpad and controller circuitry vary, it is possible for a missed detection of a logical low signal of the active high circuit, thus reading a logical high in error. Accordingly, this logic low must be checked two ways to determine assuredly that the external switchpad interface circuitry is the active high case.

Electrical floating inputs of the CMOS microcontroller must be eliminated in order to eliminate potential erratic oscillations of logic state. Therefore, microcontroller 44 will always output a logic high signal voltage at RB2 so as to pull up via 1.0 KOhm resistors R45 and R24 their respective terminals UP and DN for their respective inputs RB5 and RB4 until the microcontroller 44 is again reset. For the case of coupling to a memory type control 20 with an active low interface switchpad interface controller, both UP and DN are electrically pulled up (biased) to logic high by the massage control module microcontroller 44 whenever switchpad switches UP and DN are not actuated and are each pulled down to logic low by the lower impedance external switchpad circuitry to common whenever respective switchpad switches UP and DN are actuated. Alternatively, the microcontroller output biasing scheme for interface with active high external switchpad circuitry is the same whether the massage control module is coupled to a memory type or a non-memory type—high impedance at RB2 and logic low at RB3.

The module monitors output load current during both manual and massage operations. The module provides full output shutdown within a predetermined time, preferably within 2 milliseconds, after sensing any high current, preferably 15 amperages±3 amperages, or short to ground/B+ situation. The module resets itself and continues with normal operation only upon receipt of a switch input and correction of a fault condition.

The massage module ignores the commands from any switch considered shorted. A switch will be considered shorted when left in the on state for a predetermined amount, for example, 60 seconds+2/−0 milliseconds. The lumbar vertical motor outputs are deactivated in response to the shorted switch. When the lumbar vertical switch continues to be actuated after motion in the requested direction ceases, the massage module sends the corresponding potentiometer value to the memory seat module and identifies the switch as shorted.

The following descriptions will generally explain the more complex functions of the massage control module 34 coupled to the memory type controller 21 with several differences and exceptions noted. In the case of the massage control module 34 which interfaces with the non-memory type seat control 22, the physical packaging and the printed circuit board may be identical, although the components populating the printed circuit board differ as demonstrated in FIGS. 5 and 6. In summary, the non-memory type seat control 22 has circuitry differences including the following: elimination of all sensor output and associated feedback circuitry; modification of +REF circuitry; addition of one resistor RJ1 and elimination of all other M1 and M2 (D,E in FIG. 5) input circuitry; elimination of all UP_OUT and DN_OUT (J and I in FIG. 5) circuitry; and elimination of part, (L and K in FIG. 5) for example resistors, of the UP and DN input circuitry.

The massage control module 34 appears virtually nonexistent to the independent and priority functionality of the existing seat control system 42. Thus, the massage control module 34 is transparent to the higher priority of all functions of the existing seat control system. To accomplish this, the massage control module 34 intercepts the true lumbar support position signal from sensor 40 and provides a simulated virtual lumbar support position signal to the seat controller. By providing a virtual lumbar support sensor signal steadily representing a lumbar position to the seat controller 21, the massage control module 34 can then move the lumbar support 32 without the seat controller 21 being aware of the true and changing lumbar support position. This prevents the seat controller 21 from generating an error condition caused by movement of the lumbar support 32.

The MCM 34 also intercepts both the UP and DOWN switch inputs from the lumbar switchpad 46 and the motor drive outputs from the seat controller 21, passing along simulated signals and drive consistent with functional requirements of both the seat controller 21 and the massage control module 34. This gives dependent and lower priority control of the lumbar support 32 to the massage control module 34 so that it can perform the massage function, although virtual priority and virtual independent control always remains with the seat controller 21. This method of functional control modification is based upon the in-line modular massage control module 34 intercepting real signals and/or power and transparently substituting simulated signals and/or power between the seat controller 21 and external devices of sensor 40, motor 18, and switches 46. The case of the non-memory system 14 (FIG. 2) is simpler by virtue of not having to interface sensor signals to the seat control.

There are nine input terminals to the massage control module 34. These are, with terminal representations in parentheses: BATTERY (BATTERY), COMMON ({CHASSIS}GROUND), SENSOR +Vref (+REF), SENSOR −Vref (−REF), SENSOR INPUT (SENSOR IN), MOTOR 1 INPUT (M1), MOTOR 2 INPUT (M2), UP SWITCH INPUT (UP), and DOWN SWITCH INPUT (DN).

There are five output terminals from the massage control module 34. These are, with terminal representations in parentheses: SENSOR OUTPUT (SENSOR OUT), MOTOR 1 OUTPUT (M1_OUT), MOTOR 2 OUTPUT (M2_OUT), UP SWITCH OUTPUT (UP_OUT), and DOWN SWITCH OUTPUT (DN_OUT).

Power is supplied to the massage control module 34 at all times Nominal operating voltage is typically 12 VDC from the vehicle battery (BATTERY) with negative chassis ground as COMMON. A power save mode keeps the power drain on BATTERY to an acceptably low level at appropriate dormant times.

The position of the lumbar support 32 is intercepted directly and exclusively from the lumbar support position sensor 40 by the massage control module 34 as an analog signal via the SENSOR IN input terminal This analog signal is replicated or functionally modified as described below at the massage control module 34 to provide a signal at SENSOR OUT output terminal that is a simulated virtual representation of the lumbar support position to the seat controller. This simulated virtual SENSOR OUT signal value is generated and maintained within specific required accuracy and precision by digital pulsing of a pushpull circuit using software algorithms and decision making processes within the microcontroller 44 of the massage control module 34. Using appropriate algorithms and closed loop feedback control, the microcontroller 44 is able to monitor and anticipate drift and changes in the simulated output signal from the MCM 34. Thus, the microcomputer output signal changes to produce the desired simulated signal output voltage to the controller 21.

As shown in FIG. 3, the lumbar position sensor 40 is powered from the controller 21 when installed as part of system 12 with a memory seat controller module 21. The massage control module 34 will read the sensor positive supply voltage, as sourced from the seat controller, on the +REF input terminal for referencing of the sensor signal supply voltage. The massage control module 34 will read the sensor COMMON voltage from the seat controller on the −REF input terminal for referencing of the sensor signal voltage. When configured for use with a non-memory seat control, as shown in FIG. 4, the massage control module 34 will internally source the positive supply power and COMMON to the position sensor 40 via sensor interface +REF and −REF terminals as described below.

The lumbar support motor drive outputs from the seat control system are intercepted directly and exclusively as logic inputs by the MCM 34 at the M1 and M2 input terminals as shown in FIG. 3. These two logic inputs inform the MCM when the seat control system 12 attempts to drive the lumbar support motor 24 of the up/down drive mechanism 26 in an attempt to change the position of the lumbar support 32. With the memory module type system, the MCM 34 must present a dummy load to the output motor drive circuit relay of the seat controller 21 so that sufficient wetting current is drawn to prevent erroneous voltages caused by poor electrical contact. Actual drive to the lumbar support motor 24 is controlled and produced only by the MCM 34 for drive power output via the M1_OUT and M2_OUT output terminals to drive the lumbar support motor clockwise (CW) for up and counterclockwise (CCW) for down, respectively. M1_OUT and M2_OUT are each electrically connected to a pole terminal of one of two single pole double throw relays of form C. As shown in FIGS. 5 and 6, each relay has electrical contact terminations via a current sensing resistor to BATTERY and also, via a low impedance current sensing resistor to COMMON. Exclusive actuation (logical OR) of one relay (and not the other) will result in a positive application of voltage to M1_OUT with respect to M2_OUT to drive the lumbar support motor 24 in one direction. Exclusive actuation of the second relay will result in a reversal of voltages across M1_OUT and M2_OUT such that the lumbar support drive motor 24 will drive in the reverse direction.

Power drive from the MCM 34 to the motor 24 is also controlled by two additional final output relays having normally open form A contacts and both driven via a common switch circuit. When an open or short fault is detected that cannot be disabled by the other two relays (K1-A, K1-B), these final output relays (K2-A, K2-B) can both be de-energized to open circuit the outputs (M1_OUT, M2_OUT). Although the MCM 34 has low priority dependent control to the high virtual priority, virtual independent control of the seat controller 21, it still has actual functional control over the lumbar support motor 24 actuation.

The UP and DOWN switch inputs from the lumbar control switchpad are also intercepted directly and exclusively by the MCM. These two inputs inform the MCM 34 when the user requests a position change of the lumbar support 32. Virtual signals to the memory module 21 represents switchpad inputs simulated and produced only by the MCM 34 via the UP_OUT and DN_OUT output terminals. For the memory type seat system 12, any activation of an UP or DOWN switch input is immediately mirrored to the memory module 21 for safety reasons, but this does not preclude sending either signal to the memory module 21 otherwise, such as when neither switch is activated. This allows the MCM 34 some functional control over the lumbar support operation.

Position of the lumbar support 32 is monitored via a position sensor 40. When the motor is driven CW (CCW), the lumbar support travel is upward (downward) and the lumbar support position sensor output voltage is also going upward (downward). The motor 24 is immediately turned off when end of travel is detected, and at this point only movement in the opposite direction is allowed. Once movement in the opposite direction is detected, the end of travel software flag is released and movement in either direction is allowed. This automatic stopping and reversing of the drive motor direction at ends of lumbar support travel during lumbar massage can be annoying to some, so an alternate hardware choice is made with appropriate required changes in software algorithms.

The preferred embodiment uses an optional crankshaft assembly 48 in up down mechanism 26 and attached to the lumbar support drive motor armature which converts the motor's continuous rotational motion to the smooth reciprocating linear motion of the lumbar support 32 without the necessity of stopping and reversing the lumbar support motor drive. The motor drive shaft turns a worm gear which drives a mating crank gear which rotates a crank which reciprocates a pushrod in a well known manner. The pushrod is connected to the lumbar support 32 for its up and down motion while the motor rotates in a single direction. The sensor 40 for non-memory systems may be supplied in the crankshaft assembly 48.

The reversal of direction during motor drive in either the CW or the CCW direction, hence the reversal of the lumbar support position sensor voltage from upward to downward or from downward to upward, flags the software within the microcontroller 44 that an end of travel limit has been reached.

The preferred embodiment of a lumbar support position sensor 40 takes the form of a potentiometer film resistor with appropriate sliding contact wiper connections for supply, COMMON, and signal output as located on one axial side of the crank gear such that the signal output for continuous drive in either the CW or CCW direction is continuous and of approximately triangular waveshape. By choice, the transfer function of the sensor output voltage versus lumbar support position can be other than linear but should preferably remain monotonic, and ahysteretical versus lumbar support position. This reciprocating motion results in a system where either CW or CCW motor operation can drive the lumbar support either up or down based upon the relative position of the drive gear. By keeping track of the direction of change of the lumbar support position sensor signal and the applied drive polarity, the MCM 34 is able to determine which appropriate drive polarity to apply to the lumbar support motor 24 to drive lumbar support 32 in either desired direction.

MCM Modes

There are four basic modes of operation for the MCM 34: massage mode, manual mode, memory preset mode—only with the memory type controller module, and power save mode. The following will describe what, when, where, and why actions are performed and modes are invoked.

Massage Mode

The massage mode is entered when the UP switch is pressed for more than the UP switch debounce time, typically 20 milliseconds, but less than the massage maximum switch press time, typically 400 milliseconds. When the switch is released, the MCM will begin the massage function. During massage mode operation, the MCM 34 outputs a virtual static lumbar position signal representative of the "home" position to the seat controller 21 via the SENSOR OUT output terminal. This output signal prevents the seat controller 21 from sensing changes in the lumbar support position during the lumbar massage cycle. The lumbar support will move full travel in the up and down direction for the massage cycle time, typically ten minutes. Preferably, motion will be accomplished by actuating the lumbar motor in one direction only as discussed above.

At the completion of a preset massage cycle time, the lumbar support will return directly to the home position from which the massage mode was initiated and then stop, ending the massage cycle. The massage function can be cancelled at any time causing return of the lumbar support to the home position by activating the DOWN switch for more than the massage switch debounce press time but less than the massage maximum switch press time. To initiate the manual mode, in which case there will be immediate actuation of the lumbar support in the desired direction with concurrent resetting of the home position, see the description in more detail in the manual mode section.

An optional alternative variation to the massage mode is user taught massage where the user manually teaches the MCM 34 the specific lumbar movements to perform in a cyclical manner. This can be done with the following sequence example. First the user actuates two of the switchpad 46 switches simultaneously for some minimum time, for example 2 seconds. Second, the user manually controls the UP or DOWN switches individually with the actual desired lumbar movement and time sequence up to some maximum time, for example 20 seconds. Finally, the user actuates two switches simultaneously for some minimum time, for example 2 seconds, to initiate the cycle, which then lasts for some fixed time, for example 10 minutes. A maximum time can be allowed between switch actuations, for example three seconds, such that if exceeded, the massage learn cycle will end in default by reverting back to the initial home position whenever no UP or DOWN switches are actuated. A variation to this concept is for the operator simply to manually enter, in a similar manner, the range of movement for the lumbar support within which the lumbar massage will cycle. Other variations to this cycle should be apparent to the reader.

Another optional alternative variation to the massage mode is to allow the choice of a "slow motion" massage which is essentially similar to various massage cycles and modes previously discussed excepting that since the actuating motor has only one speed, the simulation of slow motion must take place by repeated short motor actuations in either the forward and/or the reverse direction to affect microsteps of the lumbar support and/or as desired other seat support position(s). Should the original equipment manufacturer (OEM) so choose for slow motion massage to be the only speed of massage for incorporated into the automotive seat system, then the primary reasons are eliminated for adding the optional crankshaft mechanism 48 to convert continuous motor actuation into smooth reciprocating linear up and down motion. This slow motion massage can continue for a longer period of time as desired and although not as apparent to the subject at any instant because of the subtlety of motion, can impart soothing massage which enables longer travel time, greater comfort and mental awareness. Sufficient inputs and outputs presently exist with the existing hardware to implement and control enabling and disabling of this function as desired, whether by sequences of any single switch input or by combinations including different switch inputs and sequential or simultaneous combinations of multiple switch actuator inputs.

Manual Mode

The manual mode is entered when a lumbar support position change is requested by the user by manually pressing an UP or DOWN switch for more than the massage maximum switch press time. If the MCM is in the massage mode when a manual request is detected, the MCM will respond by cancelling the massage function and immediately move the lumbar support in the direction requested by the user. These UP and DN signals are immediately mirrored to the motor controller 21 which immediately outputs an output drive to the massage control module on M1 or M2 which then outputs the appropriate drive to the lumbar support motor via M1_OUT or M2_OUT. As explained above, the drive on M1_OUT and M2_OUT do not necessarily mirror M1 and M2 because of the recirculating motion related to the crankshaft mechanism 48. When the switch is released, the massage control module actual motor drive is immediately terminated. During, and possibly subsequent to, release of either the UP or the DOWN lumbar switch, the massage control module 34 will update the seat controller to the new home position by activating a virtual switch pad output signal to the input of the seat controller while slewing the simulated position signal output directly to the new home position of the new lumbar position in response to the M1 or M2 signals from the seat controller 21. When the simulated virtual signal finally matches the true lumbar position sensor 40 signal, the massage control module 34 will turn off the simulated switch outputs and mirror and hold the virtual lumbar support position sensor signal value at the same value as the true signal.

If the massage control module 34 is in power save mode when the manual mode is entered, the manual request is immediately mirrored to the seat controller 21 which immediately outputs a motor drive signal that prompts the massage control module 34 to activate the appropriate drive signal (as explained above) to move the lumbar support motor 24 in the desired direction, while mirroring the true lumbar support sensor position signal to the seat controller 21. When the manual request is ceased, the status is immediately mirrored to the seat controller 21 which immediately discontinues its motor drive output signals which prompts the massage control module 34 to deactivate its output drives.

Memory Preset Mode

When the motor inputs (M1(D), M2(E) in FIG. 5) to the massage control module 34 are active for more than the motor input debounce time, and the switchpad inputs (L, K in FIG. 5) are not active, the function being requested by the seat controller is determined to be a memory preset, which applies only to the memory type seat controller module. When this occurs, the massage control module 34 will respond in one of two ways. If the massage control module 34 is not in the massage mode when the memory request is made, the massage control module will move the lumbar support 32 in the direction requested by the seat controller 21. The simulated signal output to the controller 21 will track that of the position sensor 40. This action is similar to the manual mode, yet is recognized as the memory preset mode since no UP or DOWN switch input is detected. If the massage control module is in the massage mode when the memory request is made the massage control module will slew the simulated sensor signal at an appropriate rate in the direction requested by the seat controller until the motor inputs are terminated. The massage control module 34 will move the lumbar support in the direction necessary to make the true lumbar sensor signal match that of the simulated sensor signal. A memory preset request will cancel a massage function in process. At the completion of the memory preset mode, the massage control module will initiate the power save mode.

Power Save Mode

When the massage control module 34 is not in a massage mode, no inputs or outputs are active, and the true sensor signal matches that of the simulated virtual signal output, the massage control module 34 will enter the power save mode. The power save mode exists to reduce the power drain on BATTERY when all functions of the massage control module are idle, which is especially important because the massage control module is normally under power with the ignition key switch off. The massage control module 34 will remain in this low power state until either a switch actuation or a motor drive input (D, E in FIG. 5) is sensed.

Numerous additional functions and features can potentially be implemented, as previously taught in the patent disclosure entitled: "IN LINE MODULE: RADIO FREQUENCY INTERFERENCE NOISE SUPPRESSION MODULE" such as the coupling of an RF noise suppressor in the motor circuit.

FIGS. 3 and 4 show a simplified block diagram of the Lumbar massage control module 34 as an IN LINE MODULE. It is apparent that the massage control module either is in series, in parallel, or combinations thereof to intercept and simulate signals between the existing seat controller and external devices such as: BATTERY, COMMON, control switches, position sensor, and motor. A portion 50 of terminals may be part of the coupling terminals, although it is preferably eliminated to simplify the housing when replaced with vehicle wiring harness adaptions.

FIGS. 5 and 6 show an electronic schematic representative of the two preferred embodiments of the invention. Its description can be broken up into parts representing its circuit functions as follows:

Power Supply Circuit:

The power supply circuit consists of: Inputs BATTERY at input terminal M and CHASSIS GROUND (COMMON) at input terminal N; metal oxide varistor (MOV) D5; capacitors C10, C1, C2, C16, C11, & C3; diode D1; resistor R47; and three terminal voltage regulator integrated circuit (IC) U2.

MOV D2 acts as a bi-directional maximum voltage transient protection device to limit maximum positive and negative transients across terminals M and N by its low impedance shunting capability only under excessive voltage conditions. Capacitor C10 is a high frequency capacitor to bypass shunt high frequency noise on BATTERY terminal M to COMMON. Diode D1 is a reverse blocking diode to prevent damage from misapplication of reverse supply bias and supplies unregulated supply B2+ for various circuit applications. Resistor R47 is a current limiting resistor to protect the three terminal linear voltage regulator U2. Capacitors C1, C16, and C11 are high frequency capacitors to bypass shunt to COMMON high frequency noise at the input and output of voltage regulator U2, reducing high frequency noise induced instability of its voltage regulation function. Capacitors C2 and C3 are voltage filters on the respective input and output of the three terminal voltage regulator IC U2. The regulated voltage Vcc, preferably 5 VDC, is supplied to the microcontroller U1 and numerous other microcontroller related input and output circuits.

Lumbar Position Input Circuit:

The Input circuitry from the lumbar position sensor consists of: Input terminals +REF at input terminal H, SENSOR IN at input terminal C, and −REF at input/output terminal G; capacitors C30, C20, and C15; and resistors R35, R36, and RJ5. Input terminal G is connected to sensor supply COMMON of the MCM 34. Input terminal H is connected both to the sensor positive supply input and to the sensor positive supply voltage of the seat controller 21 when used with memory type seat controllers. In the case of non memory control systems 14, terminal H is supplied by microcontroller 44 output RBO/INT via current limiting resistor RJ5, which resistance value is then lowered. Input terminal H is connected to high frequency capacitor C30 as a bypass shunt to COMMON for high frequency noise and also is connected via current limiting resistor RJ5 to microcontroller 44 input VREF and output RBO/INT which are both filtered by high frequency capacitor C20, as a bypass shunt to COMMON for high frequency noise. The input signal from the lumbar support position sensor at terminal C is pulled up to regulated voltage Vcc by resistor R35 and is passed via resistor R36 to high frequency capacitor C15 as a bypass shunt to COMMON for high frequency noise and to microcontroller 44 at input RAO.

Lumbar Position Output Circuit:

The output circuitry to the seat controller sensor input consists of: SENSOR OUT at output terminal F; capacitors C29, C13, C19, and C17; resistors R38, R39, 140, 141, 142, 143, and 137; and switching bipolar transistors Q10 and Q5 of types PNP and NPN, respectively.

Microcontroller 44 input RA1 receives a feedback voltage signal at input terminal RA1 via current limiting resistor 137 from the output terminal F as filtered by high frequency capacitor C17 to bypass shunt high frequency noise to COMMON. The output terminal F signal voltage is pulse controlled by a series push-pull switched circuit comprised of Vcc to transistor Q10 to resistor 138 to resistor 139 to transistor Q6 to COMMON, whereby output terminal F is taken as the node between resistors 138 and 139 such that both transistors Q10 and Q6 have protective current limiting resistors R38 and R39, respectively, in series with output terminal F. The base of transistor Q10 is pulled up to Vcc by resistor R40, holding it in the off state, and is turned on when its other base resistor R42 is pulled down to COMMON (sinked low) by microcontroller 44 output RCO. The base of transistor Q6 is pulled down to COMMON by resistor R41, holding it in the off state, and is turned on when its other base resistor R43 is sourced high (to Vcc) by microcontroller 44 output RC1. Transistor switch Q10 is used to charge output capacitors C19, C13, C29 and transistor switch Q6 is used for their discharge. Capacitor C19 provides filtering of the output voltage at node N13. Capacitors C13 and C39 are high frequency capacitors to bypass shunt high frequency noise from the output terminal F to COMMON.

With feedback monitoring and appropriate software algorithms, such as drift control protection, to control the switched pulsing of transistors Q10 and Q6, the MCM 34 maintains control of the output voltage over a range from COMMON to Vcc. The feedback voltage as read by the microcontroller 44 at input RA1 is compared with the desired output voltage, the difference affecting the number of fixed duration pulses necessary at either transistor Q10 to raise the output voltage or at transistor Q6 to lower the output voltage. The output voltage is read by the microcontroller 44 which then turns on either transistor Q10 or Q6 in a pulsing manner to respectively raise or lower the output voltage to the desired level. When the voltage at the output varies from the desired output voltage, the microcontroller 44 uses software algorithms to determine the length of time for the voltage change and how many pulses it took to correct the voltage change. In anticipation of similar drift characteristics, the microcontroller 44 will then pulse either transistor Q10 or transistor Q6 to maintain the desired output voltage. This algorithm is adaptive and can be used for static and dynamic output voltages desired to obtain preferred rates for seat movement.

Motor Drive Input:

The motor drive input circuitry consists of: Input terminals M1 at input terminal D and M2 at input terminal E; resistors R44, R17, R19, R22, R18 and RJ1; and capacitors C7, and C6.

A dummy load resistor R44 is placed across input terminals D and E to provide the requisite wetting current for reliable seat controller relay contact electrical operation only for use with the memory type seat controllers 12.

Polarity of voltage applied from input terminal D to input terminal E is nominally positive or negative 12 VDC depending on the respective desired clockwise or counterclockwise drive direction of the lumbar support motor 24. This 12 VDC (negative COMMON) low impedance voltage source must be reduced in voltage and current limited for input to the microcontroller 44 at respective inputs RB7 and RB8. The voltage signal of input terminal D is current limited by resistor R17 and voltage reduced by a voltage divider comprised of resistors R17 and R18 to COMMON with the node N14, between the two resistors, being provided as the microcontroller 44 input RB7 as filtered by high frequency capacitor C6 for bypass shunt of high frequency noise to COMMON. The voltage signal of input terminal E is current limited by resistor R19 and is voltage reduced by a voltage divider comprised of resistors R19 and R22 to COMMON with the node N15, between the two resistors, being provided as the microcontroller 44 input RB8 as filtered by high frequency capacitor C7 for bypass shunting of high frequency noise to COMMON.

An additional load resistor RJ1 is placed across microcontroller 44 bi-directional input/output ports RB7 and RB6 only for use with the non-memory type seat controller so that the microcontroller can determine whether the non-memory type or the memory type interface circuit is interfaced by sensing whether a high and low input are seen at port RB7 when port RB6 outputs a respective high and low signal and whether a high and low input are seen port RB6 when port RB7 outputs a respective high and low signal.

Motor Drive Output:

The motor drive output circuitry includes: Output terminals M1_OUT at output terminal B and M2_OUT at output terminal A; relays K1-A, K1-B, K2-A, and K2-B; freewheeling diodes D2, D3, and D30; bipolar switching transistors Q1, Q2, Q11, and Q12; and resistors R55, R21, R52, R53, R54, R56, R34, R1, R2, R3, R4, R15, and R16.

Relays K1-A and K1-B have 12 VDC coils and form C contacts (single pole double throw, one contact normally closed when unenergized), the unenergized-coil contacts tied to power lowside (COMMON) via current sensing resistor R56 and the energized-coil contacts tied to power highside (B+) via current sensing resistor R55. Lowside NPN switching transistor Q1 in open collector configuration drives relay K1-A coil. The base of transistor Q1 is pulled down to COMMON by resistor R1 and is driven via a resistor R2 by microcontroller 44 output RC7. Lowside NPN switching transistor Q2 in open collector configuration drives relay K1-B coil. The base of transistor Q2 is pulled down to COMMON by resistor R3 and is driven via resistor R4 by microcontroller 44 output RC6.

Free-wheeling diodes D2, D3, and D30 are for discharge to B2+ of the field collapse current generated by coils of associated relays K1 and K2.

The lowside analog current signal produced by voltage drop of load current across resistor R56 to COMMON is passed through current limiting resistor R34 input to microcontroller 44 input RA2 where it is analog-to-digital converted to 8 bit (256 count) resolution. Based upon the resistor values chosen in the preferred embodiment, each count represents 20 millivolts and therefore a count of 7 represents 140 millivolts which represents 14 amperes of load current which is determined to be excessive current for fault sensing with the programmed algorithms. The highside current limit signal is produced by voltage drop of motor load current across resistor R65 from B+ to the load which is passed through resistor R21 to the base of highside PNP transistor Q11. Transistor Q11 has a lowside resistive voltage divider comprised of resistors R52 and R53 to COMMON, the divided voltage signal of which is passed through current limiting resistor R54, for input to the microcontroller 44 input RB1. The high side limit is a go or no go type of limit sense, switching on Q11 at approximately 14 amperes of load current.

Sensing of excessive current across low side resistor R56 indicates a motor short to a power supply source such as B+. Sensing of excessive current across high side resistor R55 indicates a motor short to a power sink such as COMMON. Sensing excessive current across resistor R56 and R55 indicates a short across the motor or a short to some source node between B+ and COMMON. By sensing of highside current limit and lowside analog current with controlled actuation of relay states of K1-A and/or K1-B, it is possible for the microcontroller 44 with software algorithms to monitor the status of relay K1-A and K1-B input current and/or relay output current as normal, open, and short.

For protection against most shorts to power, COMMON, and/or other voltage nodes, the controlled output from microcontroller 44 output RA5 can be held low (to COMMON). This will result in deactivation of both 12 volt coils of both form A (single pole single throw, normally open contacts) output relays K2-A and K2-B via resistor R16 to the base of their common control lowside NPN switching transistor Q12, the base of which is also pulled to COMMON by resistor R15. Simultaneous deactivation of relays K2-A and K2-B open circuits the pole outputs from relays K1-B and K1-A, respectively, such that the terminals B and A to the motor are disconnected, therefore no current will be sourced to or sinked from the motor circuit by the MCM 34.

Fault conditions can be detected by the following states: Low range lowside current with either relay energized; normal range lowside current with no relay energized; normal range lowside current with both relays energized; high lowside current with no relay energized; high lowside current with both relays energized; high lowside current with either relay energized; high highside current with no relay energized; high highside current with both relays energized; and high highside current with either relay energized. Fault status of the seat control power system can be monitored by the controlling the four power system output states of: 1) No relay energized, 2) only relay K1-A energized, 3) only relay K1-B energized, and 4) both K1-A and K1-B energized and monitoring the system conditions of: 1) No lowside current, 2) normal lowside current, 3) high lowside current, 4) normal highside current, and 5) high highside current.

Switch Input:

The switch input circuitry consists of: Input terminal UP at input terminal L and terminal DN at input terminal K; diodes D14, D13, D12, and D11; resistors R51, R50, R24, R45, R46, R23, R48, and R49; and capacitors C9, C8, C28, and C27.

Input terminals L and K are each connected via resistors R45 and R24, respectively, to microcontroller 44 input RB2 and to high frequency noise filter capacitor C27 to bypass shunt high frequency noise to COMMON. Input terminals L and K are also each connected via resistors R23 and R46, respectively, to microcontroller 44 input RB3 and to high frequency noise filter capacitor C28 to bypass shunt high frequency noise to COMMON.

Diodes D14 and D13 are for the purpose of DC shifting the low signal from input terminal L down by two diode drops to insure that logic low will be seen as low despite an allowable difference in power supply COMMON voltage difference of one volt between the seat controller 21 and the MCM 34. And likewise, diodes D12 and D11 are for the purpose of DC shifting the low signal from input terminal K down by two diode drops to insure that logic low will be seen as low despite an allowable difference in power supply COMMON voltage difference of one volt between the seat controller 21 and the MCM 34.

Resistors R49 and R48 are to pull down to COMMON the nodes N16 and N17, respectively. The signal on node N16 representing UP (manual control lumbar support upward) switch actuation is input to microcontroller 44 input RB5 via current limiting resistor R51 and is filtered by high frequency capacitor C8 to bypass shunt high frequency noise to COMMON. The signal on node N17 representing DN (manual control lumbar support downward) switch actuation is input to microcontroller 44 input RB4 via current limiting resistor R50 and is filtered by high frequency capacitor C9 to bypass shunt high frequency noise to COMMON.

Switch Output:

The switch output circuitry includes: Output terminals UP_OUT at output terminal I and UP_OUT at output terminal J; capacitors C25, C4, C26, and C5; resistors R9, R5, R10, R8, R11, R12, R5, R7, R28, R13, R29, R27, R30, R31, R14, and R26; bipolar PNP switching transistors Q3 and Q7; and bipolar NPN switching transistors Q4, Q5, Q8, and Q9.

Microcontroller 44 is simulating 12 VDC and/or COMMON switch signals at the output terminals J and I using a 5 VDC supply. This is accomplished by use of four microcontroller drive outputs acting as two push/pull pairs with cascaded switching transistors in a push/pull final output stage drive by B2+ driven by the two switch outputs (J & I in FIG. 5).

To drive the output terminal J with a high signal, microcontroller 44 output RC2 is driven high to Vcc, which via resistor R12, drives transistor Q5 on while microcontroller 44 output RC3 is simultaneously driven low to COMMON. Transistor Q5 also has its base connected to COMMON by resistor R11 so that it is held off when not drive by the microcontroller 44. Transistor Q5 pulls down the base of transistor Q3 via resistor R8. Transistor Q8 has its base connected to B2+ by resistor R18 so that it is held off when not driven by transistor Q5. Transistor Q3 is a highside switch that drives the output terminal J via resistor R9. The output terminal is filtered by high frequency capacitors C25 and C4 which bypass shunt high frequency noise to the COMMON.

To drive the output terminal J with a low signal, microcontroller 44 output RC3 is driven high to Vcc which via resistor R7 drives transistor Q4 on, while microcontroller 44 output RC2 is simultaneously driven low to COMMON. Transistor Q4 has its base connected to COMMON by resistor R6 so that it is held off when not driven by the microcontroller 44. Transistor Q4 is a low side switch that pulls down the output terminal J via resistor R5.

To drive the output terminal I with a high signal for DN_OUT, microcontroller 44 output RC4 is driven high to Vcc which via resistor R31 drives transistor Q9 on, while microcontroller U1 output RC5 is simultaneously driven low to COMMON. Transistor Q9 has its base connected to COMMON by resistor R30 so that it is held off when not driven by the microcontroller 44. Transistor Q9 pulls down the base of transistor Q7 via resistor R27. Transistor Q7 has its base connected to B2+ by resistor R29 so that it is held off when not driven by transistor Q9. Transistor Q7 is a highside switch that drives the output terminal I via resistor R28. The output terminal is filtered to COMMON by high frequency capacitors C26 and C5 which bypass shunt high frequency noise to the COMMON.

To drive the output terminal I with a low signal, microcontroller 44 output RC5 is driven high to Vcc, which via resistor R26 drives transistor Q8 on, while microcontroller 44 output RC4 is simultaneously driven low to COMMON. Transistor Q8 has its base connected to COMMON by resistor R14 so that it is held off when not driven by the microcontroller U1. Transistor Q8 is a low side switch that pulls down the output terminal I via resistor R13.

Microcontroller:

In the preferred embodiment, only one microcontroller, model PIC16C72-04 from Microchip Technology Inc., is used for all MCM 34 applications having software programmed to accommodate all current customers, interface I/O systems, and models. This microcontroller 44 is essentially a microprocessor with integral RAM and ROM. It should be obvious that future embodiments would allow for alternative microcontrollers and/or alternative software algorithms specific to the application requirements. Microcontroller circuitry includes: Vcc, COMMON, oscillator, and I/O. Vcc is supplied to power the microcontroller 44 terminal labeled VDD and is filtered by high frequency capacitors C24 and C14 which bypass shunt high frequency noise to COMMON. Vcc is supplied via resistor R25 to microcontroller 44 at its reset pin MCLR(active low)/R. COMMON is supplied to the microcontroller 44 via two terminals labeled VSS, one of which is also connected to Vcc via high frequency capacitor C18 to act as a bypass shunt for high frequency noise between Vcc and Common. A three terminal oscillator X1 is connected to the microcontroller 44 at the terminals labeled OSC1 and OSC2. Oscillator X1 is also terminated at COMMON and internally contains a 4.000 MHz crystal oscillator with two integral capacitors. All microcontroller I/O pins labeled as RA#, RB#, and RC#, # representing some number from 0 to 7, are ports which have an internal electronic totem pole structure enabling bi-directional and tri state capability to: Read a logical value, output a logical high value, output a logical low value, and output a high impedance virtual open circuit. Also, I/O ports RA0/AN-O, RA1/AN, RA2/AN2, RA3/AN3, and RA5/AN4 have capability to read in analog voltage values.

Having thus described embodiments of the present invention, many modifications will become apparent to those of ordinary skill in the art to which it pertains without departing from the scope and spirit of the present invention as defined in the appended claims.

What is claimed is:

1. A seat control module for introducing massage to a seat control with an adjustable lumbar support, and control actuators, the control module comprising:
    a modular housing including in-line connectors for coupling said module to a seat control harness connector;
    an intercept interface for receiving inputs from said control actuators;
    a driver for repeatedly adjusting said lumbar support position through a predetermined range of movement in response to one of said control actuators; and
    a transparency simulator for maintaining full function of said seat control and removing indications of repeatedly adjusting said lumbar support position.

2. The invention as defined in claim 1 wherein said seat control include a memory control module with a seat control harness connector, and said seat control module further comprises an in-line coupler complimentary to said memory control module harness connector.

3. The invention as defined in claim 1 wherein said transparency simulator comprises an electronic noise filter.

4. The invention as defined in claim 3 wherein said seat control comprises a motor and said electronic noise filter comprises an RF suppression filter.

5. The invention as defined in claim 1 wherein said transparency simulator comprises time-based response to manipulation of said control actuators.

6. The invention as defined in claim 5 wherein said transparency simulator generates a first output in response to a manipulation of a said control actuator for a period of time less than a first predetermined period, and generating a second output in response to a manipulation of said control actuator for a period equal to or greater than said first predetermined time period.

7. A seat control mechanism comprising:
    a vehicle seat having a position adjustment mechanism, wherein said mechanism includes a lumbar support, at least one motor, and an adjustor responsive to said motor for displacing said lumbar support;
    a motor control including at least one actuator for actuating said motor and said adjustor; and
    a massage control module including an intercept interface for receiving an output from said at least one actuator, a driver circuit for signaling said motor to repeatedly adjust said lumbar support as an enhanced movement, and a transparency simulator for maintaining original movement and inducing said enhanced movement of said lumbar support, said driver discriminating between a first predetermined movement of said at least one actuator and a second movement of said at least one actuator before signaling an enhanced movement of said lumbar support or maintaining original movement.

8. The invention as defined in claim 6 wherein a first of said at least one actuator is enabled for a first period less than a predetermined time to trigger said enhanced movement, and said first actuator is enabled for a second period equal to or greater than said predetermined time to trigger said original movement.

9. The invention as defined in claim 6 wherein said transparency simulator comprises an electronic noise filter.

10. The invention as defined in claim 8 wherein said filter includes a RF suppression filter in said driver.

11. The invention as defined in claim 6 wherein said lumbar support adjustor includes an extender.

12. The invention as defined in claim 6 wherein said lumbar support adjustor includes a movement mechanism for displacing the lumbar support upwardly and downwardly in the seat back.

13. The invention as defined in claim 7 wherein said seat control mechanism includes a selector for adjusting the speed of said displacing said lumbar support.

14. The invention as defined in claim 7 wherein said seat control mechanism includes an extender for displacing said lumbar support in at least one additional direction.

15. The invention as defined in claim 7 wherein said seat control mechanism includes multiple adjustors for displacing said lumbar support in multiple directions.

* * * * *